United States Patent
Bo et al.

(10) Patent No.: US 9,431,248 B2
(45) Date of Patent: Aug. 30, 2016

(54) HIGH TILT ANGLE PLUS TWIST DRAIN EXTENSION IMPLANT FOR CHC LIFETIME IMPROVEMENT

(71) Applicant: Texas Instruments Incorporated, Dallas, TX (US)

(72) Inventors: Xiang-Zheng Bo, Plano, TX (US); Alwin Tsao, Garland, TX (US); Douglas T. Grider, McKinney, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/874,234

(22) Filed: Oct. 2, 2015

(65) Prior Publication Data

US 2016/0027647 A1    Jan. 28, 2016

Related U.S. Application Data

(63) Continuation of application No. 14/142,251, filed on Dec. 27, 2013, now Pat. No. 9,177,802.

(60) Provisional application No. 61/747,692, filed on Dec. 31, 2012.

(51) Int. Cl.
| | |
|---|---|
| *H01L 21/265* | (2006.01) |
| *H01L 21/266* | (2006.01) |
| *H01L 21/8234* | (2006.01) |
| *H01L 29/66* | (2006.01) |

(52) U.S. Cl.
CPC ....... *H01L 21/26586* (2013.01); *H01L 21/266* (2013.01); *H01L 21/26513* (2013.01); *H01L 21/823412* (2013.01); *H01L 21/823418* (2013.01); *H01L 21/823437* (2013.01); *H01L 29/6659* (2013.01)

(58) Field of Classification Search
CPC ................ H01L 21/26586; H01L 21/823418; H01L 21/823437; H01L 21/26513; H01L 21/823412; H01L 21/266; H01L 29/6659
See application file for complete search history.

(56) References Cited

U.S. PATENT DOCUMENTS

| | | | | |
|---|---|---|---|---|
| 6,489,223 B1 * | 12/2002 | Hook | ................ | H01L 21/26586 257/E21.345 |
| 7,144,782 B1 * | 12/2006 | Ehrichs | ............. | H01L 21/26586 257/E21.345 |

(Continued)

*Primary Examiner* — Evan Pert
*Assistant Examiner* — Farid Khan
(74) *Attorney, Agent, or Firm* — Jacqueline J. Garner; Frank D. Cimino

(57) ABSTRACT

An integrated circuit containing an analog MOS transistor may be formed by implanting drain extensions with exactly four sub-implants wherein at least one sub-implant implants dopants in a substrate of the integrated circuit at a source/drain gate edge of the analog MOS transistor at a twist angle having a magnitude of 5 degrees to 40 degrees with respect to the source/drain gate edge of the analog MOS transistor, for each source/drain gate edge of the analog MOS transistor, wherein a zero twist angle sub-implant is perpendicular to the source/drain gate edge. No more than two sub-implants put the dopants in the substrate at any source/drain gate edge of the analog MOS transistor. All four sub-implants are performed at a same tilt angle. No halo implants are performed on the analog MOS transistor.

9 Claims, 6 Drawing Sheets

(56) References Cited

U.S. PATENT DOCUMENTS

| | | | |
|---|---|---|---|
| 2004/0063262 A1* | 4/2004 | Feudel | H01L 21/26513 438/197 |
| 2005/0148114 A1 | 7/2005 | Rhodes | |
| 2008/0211031 A1* | 9/2008 | Sakuma | H01L 21/823412 257/368 |
| 2010/0327361 A1* | 12/2010 | Benaissa | H01L 21/26586 257/368 |
| 2011/0210388 A1 | 9/2011 | Chen et al. | |
| 2012/0119298 A1* | 5/2012 | Wu | H01L 21/823412 257/368 |
| 2012/0241864 A1* | 9/2012 | Gerhardt | H01L 21/26586 257/368 |
| 2014/0110783 A1 | 4/2014 | Zhang | |
| 2014/0183631 A1* | 7/2014 | Hao | H01L 21/823412 257/338 |

* cited by examiner

HIGH TILT ANGLE PLUS TWIST DRAIN EXTENSION IMPLANT FOR CHC LIFETIME IMPROVEMENT

CROSS-REFERENCE TO RELATED APPLICATIONS

This application is a continuation of application Ser. No. 14/142,251 filed Dec. 27, 2013 and claims the benefit of priority under U.S.C. §119(e) of U.S. Provisional Application 61/747,692 (Texas Instruments docket number TI-69124P) filed Dec. 31, 2012, both of which are hereby incorporated by reference in its entirety.

FIELD OF THE INVENTION

This invention relates to the field of integrated circuits. More particularly, this invention relates to MOS transistors in integrated circuits.

BACKGROUND OF THE INVENTION

Some integrated circuits contain analog metal oxide semiconductor (MOS) transistors which have drain extensions in a substrate of the integrated circuit adjacent to, and extending partway under, gates of the analog MOS transistors. The analog MOS transistors have no halo implanted regions. It is desirable to implant dopants to form the drain extensions so as to provide laterally graded junctions to obtain channel hot carrier (CHC) reliability. Implants to form the drain extensions are angled at a tilt angle (referenced to a perpendicular line to a top surface of the integrated circuit) to produce a graded junction that extends a desired distance under the gates. The angled implants typically have tilt angles of 25 degrees to 30 degrees, with zero twist angles, that is, the implants are perpendicular to source/drain edges of the gates. The implants are performed in a series of four sub-implants with equal doses and rotated by 90 degrees for each sub-implant to provide symmetric implants with uniform dosing on all sides of all the analog MOS transistors. However, some integrated circuits are dense, so that an implant mask, typically photoresist, blocks the angled implant with zero twist from reaching the substrate at the source/drain edges of the gates. For these cases, the implants are performed in a series of four sub-implants at twist angles of 45 degrees, which provides more CHC reliability than the zero twist implants, but results in less CHC reliability than desired.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to a more detailed description that is presented later.

An integrated circuit containing an analog MOS transistor may be formed by implanting drain extensions with exactly four sub-implants wherein at least one sub-implant implants dopants in a substrate of the integrated circuit at a source/drain gate edge of the analog MOS transistor at a twist angle having a magnitude of 5 degrees to 40 degrees with respect to the source/drain gate edge of the analog MOS transistor, for each source/drain gate edge of the analog MOS transistor, wherein a zero twist angle sub-implant is perpendicular to the source/drain gate edge. No more than two sub-implants implant the dopants in the substrate at any source/drain gate edge of the analog MOS transistor. Two of the sub-implants are blocked from the source/drain gate edge by a gate of the analog MOS transistor. All four sub-implants are performed at a same tilt angle of at least 15 degrees, referenced to a perpendicular line to a top surface of a substrate of the integrated circuit, which is sufficient for the at least one sub-implant to clear an implant mask and implant the dopants in the substrate at the source/drain gate edge, for each source/drain gate edge of the analog MOS transistor. No halo implants are performed on the analog MOS transistor.

An integrated circuit containing a first analog MOS transistor and a second analog MOS transistor, wherein source/drain gate edges of the first and second analog MOS transistors are all substantially parallel to one another, may be formed by implanting drain extensions with exactly four sub-implants. Two sub-implants implant dopants in a substrate of the integrated circuit at a source/drain gate edge of the first and second analog MOS transistors, each at a twist angle having a magnitude of 5 degrees to 40 degrees with respect to the source/drain gate edge, and two of the sub-implants are blocked from the source/drain gate edge by a gate of the analog MOS transistor, for each source/drain gate edge. All four sub-implants are performed at a same tilt angle of at least 15 degrees which is sufficient for the sub-implants to clear an implant mask and implant the dopants in the substrate at the relevant source/drain gate edge. No halo implants are performed on the first and second analog MOS transistors.

An integrated circuit containing a first analog MOS transistor and a second analog MOS transistor, wherein source/drain gate edges of the first analog MOS transistor are substantially perpendicular to source/drain gate edges of the second analog transistor, may be formed by implanting drain extensions with exactly four sub-implants. One sub-implant implants dopants in a substrate of the integrated circuit at a first source/drain gate edge of the first analog MOS transistor, at a twist angle having a magnitude of 5 degrees to 40 degrees with respect to the first source/drain gate edge, one sub-implant implants dopants in the substrate at the first source/drain gate edge at a twist angle having a magnitude of 50 degrees to 85 degrees, and two of the sub-implants are blocked from the first source/drain gate edge by a gate of the first analog MOS transistor. Similarly, the substrate at a second source/drain gate edge receives dopants from another of the four sub-implants at a twist angle having a magnitude of 5 degrees to 40 degrees, and another at a twist angle having a magnitude of 50 degrees to 85 degrees, while the remaining two sub-implants are blocked by the gate. Analogously, a first source/drain gate edge of the second analog MOS transistor receives dopants from one of the four sub-implants at a twist angle having a magnitude of 5 degrees to 40 degrees, and one at a twist angle having a magnitude of 50 degrees to 85 degrees, while the remaining two sub-implants are blocked by the gate, and similarly for a second source/drain gate edge of the second analog MOS transistor. All four sub-implants are performed at a same tilt angle of at least 15 degrees which is sufficient for the sub-implants to clear an implant mask and implant the dopants in the substrate at the relevant source/drain gate edge. No halo implants are performed on the first and second analog MOS transistors.

DETAILED DESCRIPTION OF EXAMPLE EMBODIMENTS

Figure 1A:
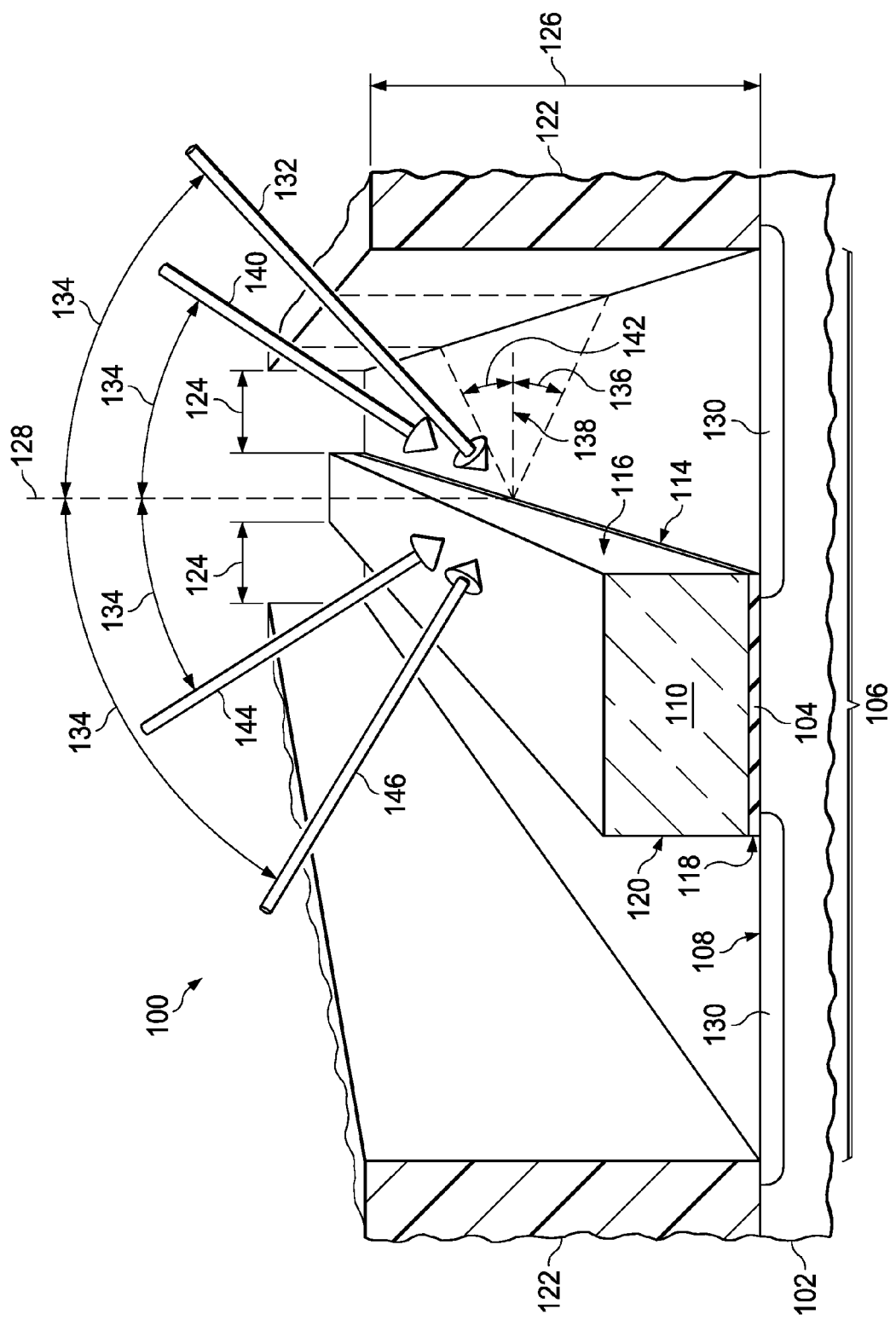
FIG. 1A and FIG. 1B are cross sections of an integrated circuit containing an analog MOS transistor, formed according to an example method, depicted in successive stages of fabrication.

The present invention is described with reference to the attached figures. The figures are not drawn to scale and they are provided merely to illustrate the invention. Several aspects of the invention are described below with reference to example applications for illustration. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

An integrated circuit containing an analog MOS transistor may be formed by implanting drain extensions with exactly four sub-implants wherein at least one sub-implant implants dopants in a substrate of the integrated circuit at a source/drain gate edge of the analog MOS transistor at a twist angle having a magnitude of 5 degrees to 40 degrees with respect to the source/drain gate edge of the analog MOS transistor, for each source/drain gate edge of the analog MOS transistor, wherein a zero twist angle sub-implant is perpendicular to the source/drain gate edge. No more than two sub-implants implant the dopants in the substrate at any source/drain gate edge of the analog MOS transistor. Two of the sub-implants are blocked from the source/drain gate edge by a gate of the analog MOS transistor. All four sub-implants are performed at a same tilt angle of at least 15 degrees, referenced to a perpendicular ray to a top surface of a substrate of the integrated circuit, which is sufficient for the at least one sub-implant to clear an implant mask and implant the dopants in the substrate at the source/drain gate edge, for each source/drain gate edge of the analog MOS transistor. No halo implants are performed on the analog MOS transistor.

An integrated circuit containing a first analog MOS transistor and a second analog MOS transistor, wherein source/drain gate edges of the first and second analog MOS transistors are all substantially parallel to one another, may be formed by implanting drain extensions with exactly four sub-implants. Two sub-implants implant dopants in a substrate of the integrated circuit at a source/drain gate edge of the first and second analog MOS transistors, each at a twist angle having a magnitude of 5 degrees to 40 degrees with respect to the source/drain gate edge, and two of the sub-implants are blocked from the source/drain gate edge by a gate of the analog MOS transistor, for each source/drain gate edge. All four sub-implants are performed at a same tilt angle of at least 15 degrees which is sufficient for the sub-implants to clear an implant mask and implant the dopants in the substrate at the relevant source/drain gate edge. No halo implants are performed on the first and second analog MOS transistors.

An integrated circuit containing a first analog MOS transistor and a second analog MOS transistor, wherein source/drain gate edges of the first analog MOS transistor are substantially perpendicular to source/drain gate edges of the second analog transistor, may be formed by implanting drain extensions with exactly four sub-implants. One sub-implant implants dopants in a substrate of the integrated circuit at a first source/drain gate edge of the first analog MOS transistor, at a twist angle having a magnitude of 5 degrees to 40 degrees with respect to the first source/drain gate edge, one sub-implant implants dopants in the substrate at the first source/drain gate edge at a twist angle having a magnitude of 50 degrees to 85 degrees, and two of the sub-implants are blocked from the first source/drain gate edge by a gate of the first analog MOS transistor. Similarly, the substrate at a second source/drain gate edge receives dopants from another of the four sub-implants at a twist angle having a magnitude of 5 degrees to 40 degrees, and another at a twist angle having a magnitude of 50 degrees to 85 degrees, while the remaining two sub-implants are blocked by the gate. Analogously, a first source/drain gate edge of the second analog MOS transistor receives dopants from one of the four sub-implants at a twist angle having a magnitude of 5 degrees to 40 degrees, and one at a twist angle having a magnitude of 50 degrees to 85 degrees, while the remaining two sub-implants are blocked by the gate, and similarly for a second source/drain gate edge of the second analog MOS transistor. All four sub-implants are performed at a same tilt angle of at least 15 degrees which is sufficient for the sub-implants to clear an implant mask and implant the dopants in the substrate at the relevant source/drain gate edge. No halo implants are performed on the first and second analog MOS transistors.

Forming the drain extensions using exactly four sub-implants at the same tilt angle advantageously reduces fabrication complexity and cost of the integrated circuit compared to using more than four sub-implants or more than one tilt angle. Throughput through the ion implanter is improved by performing all four sub-implants at the same tilt angle.

Figure 1B:
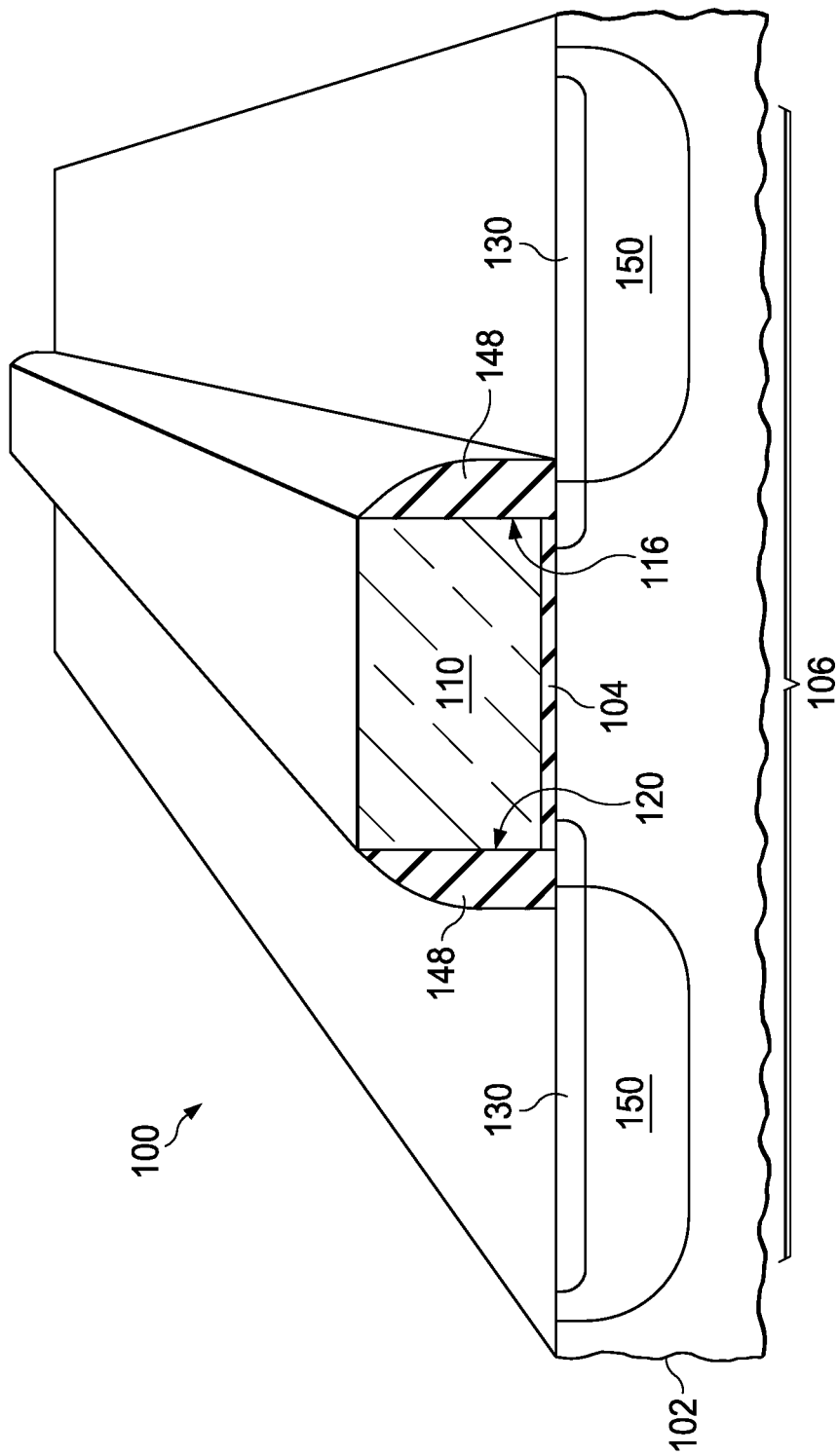

FIG. 1A and FIG. 1B are cross sections of an integrated circuit containing an analog MOS transistor, formed according to an example method, depicted in successive stages of fabrication. The integrated circuit 100 is formed on a substrate 102 which includes semiconductor material such as silicon, silicon-germanium, silicon carbide, gallium arsenide, gallium nitride or aluminum gallium nitride. The substrate 102 may be a single crystal silicon wafer, an epitaxial layer on a handle wafer, or other substrate appropriate for forming the integrated circuit 100. A gate dielectric layer 104 of the analog MOS transistor 106 is formed at a top surface 108 of the substrate 102. The gate dielectric layer 104 may be formed by thermal oxidation of silicon in the substrate 102 or may be deposited by a plasma enhanced chemical vapor deposition (PECVD) process or an atomic layer deposition (ALD) process. A gate 110 of the analog MOS transistor 106 is formed over the gate dielectric layer 104. The analog MOS transistor 106 has a first source/drain gate edge 114 at the top surface 108 of the substrate 102 directly under a first lateral surface 116 of the gate 110. The analog MOS transistor 106 has a second source/drain gate edge 118 at the top surface 108 of the substrate 102 directly under a second lateral surface 120 of the gate 110. The first source/drain gate edge 114 and the second source/drain gate edge 118 are on opposite sides of the gate 110. A layer of silicon dioxide, not shown, referred to as a pad oxide, 1 nanometer to 10 nanometers thick, may be formed over the substrate to protect the top surface 108 of the substrate 102 during subsequent implant processes.

An implant mask 122 is formed over the substrate 102 so as to expose at least a portion of the gate 110 and expose a portion of the substrate 102 adjacent to the gate 110. The implant mask 122 is separated from the first source/drain gate edge 114, and is separated from the second source/drain gate edge 118, by substantially equal lateral spaces 124. The implant mask 122 has a height 126 above the top surface 108 of the substrate 102. The height 126 and the lateral space 124 may be such that an implant with zero twist and at a tilt angle of 30 degrees, referenced to a perpendicular line 128 to the top surface 108 of the substrate 102, would be blocked by the implant mask 122 from reaching the first source/drain gate edge 114.

Drain extensions 130 are formed in the substrate 102 adjacent to, and partially underlapping, the gate 110 at the first source/drain gate edge 114 and the second source/drain gate edge 118 by implanting dopants in exactly four sub-implants. For a version of the instant example wherein the analog MOS transistor 106 is n-channel, the dopants implanted to form the drain extensions 130 are n-type dopants such as phosphorus and/or arsenic. For a version of the instant example wherein the analog MOS transistor 106 is p-channel, the dopants implanted to form the drain extensions 130 are p-type dopants such as boron and/or gallium. Boron may be implanted as $BF_2$. A first sub-implant 132 of the four sub-implants is at a tilt angle 134 of at least 15 degrees referenced to the perpendicular line 128, and at a first twist angle 136 having a magnitude of 5 degrees to 40 degrees referenced to a horizontal normal line 138 which lies in the top surface 108 and is perpendicular to the first source/drain gate edge 114. The tilt angle 134 is selected so that the first sub-implant 132 clears the implant mask 122 to implant a desired amount of dopants into the substrate 102 at the first source/drain gate edge 114. The first twist angle 136 may be selected to advantageously provide higher CHC reliability for the analog MOS transistor 106 compared to a sub-implant with a twist angle of 45 degrees.

A second sub-implant 140 of the four sub-implants is at the tilt angle 134 referenced to the perpendicular line 128, and at a second twist angle 142 referenced to the horizontal normal line 138, opposite from the first twist angle 136. The second twist angle 142 may be 5 degrees to 40 degrees, or may be 50 degrees to 85 degrees. The second sub-implant 140 also clears the implant mask 122 to implant a desired amount of dopants into the substrate 102 at the first source/drain gate edge 114. In one version of the instant example, a dose of the second sub-implant 140 may be substantially equal to a dose of the first sub-implant 132. In an alternate version, the dose of the second sub-implant 140 may be different from the dose of the first sub-implant 132 by at least 10 percent.

A third sub-implant 144 of the four sub-implants is at the tilt angle 134 and is at a twist angle which is 180 degrees from the first twist angle 136, so that the third sub-implant 144 is opposite from the first sub-implant 132. The third sub-implant 144 is blocked from the substrate 102 at the first source/drain gate edge 114 by the gate 110. Similarly, a fourth sub-implant 146 of the four sub-implants is at the tilt angle 134 and is at a twist angle which is 180 degrees from the second twist angle 142, so that the fourth sub-implant 146 is opposite from the second sub-implant 140. The fourth sub-implant 146 is also blocked from the substrate 102 at the first source/drain gate edge 114 by the gate 110. The third sub-implant 144 and the fourth sub-implant 146 clear the implant mask 122 to implant a desired amount of dopants into the substrate 102 at the second source/drain gate edge 118. Performing the third sub-implant 144 at the twist angle which is 180 degrees from the first twist angle 136 also advantageously provides higher CHC reliability for the analog MOS transistor 106 compared to a sub-implant with a twist angle of 45 degrees referenced to a horizontal line perpendicular to the second source/drain gate edge 118. In one version of the instant example, a dose of the third sub-implant 144 and a dose of the fourth sub-implant 146 may be substantially equal to a dose of the first sub-implant 132. In an alternate version, the dose of the third sub-implant 144 and/or a dose of the fourth sub-implant 146 may be different from the dose of the first sub-implant 132 by at least 10 percent. Forming the drain extension 130 on a drain side of the analog MOS transistor 106 with a lower dose may advantageously improve a breakdown voltage of the analog MOS transistor 106.

The implant mask 122 is removed after the four sub-implants 132, 140, 144 and 146 are completed. The implant mask 122 may be removed by ashing followed by a wet clean in an aqueous mixture of ammonium hydroxide and hydrogen peroxide or a wet clean in an aqueous mixture of sulfuric acid and hydrogen peroxide.

Referring to FIG. 1B, formation of the integrated circuit 100 is continued with formation of sidewall spacers 148 on lateral surfaces of the gate 110 including the first lateral surface 116 and the second lateral surface 120, overlapping portions of the drain extensions 130. The sidewall spacers 148 may include one or more layers of silicon nitride, silicon oxynitride and/or silicon dioxide. The sidewall spacers 148 may be formed by forming a conformal layer of sidewall material over the gate 110 and substrate 102, and subsequently removing the sidewall material from over a top surface of the gate 110 and over the top surface 108 of the substrate 102 using an anisotropic plasma etch process, leaving the sidewall spacers 148 in place.

After the sidewall spacers 148 are formed, source/drain regions 150 are formed in the substrate 102 adjacent to, and partially underlapping, the sidewall spacers 148. The source/drain regions 150 may be formed by implanting dopants into the substrate using the sidewall spacers 148 as part of an implant mask so that edges of the sidewall spacers 148 define edges of the source/drain regions 150 proximate to the gate 110. The source/drain regions 150 have a same conductivity type as the drain extensions 130.

Figure 2:
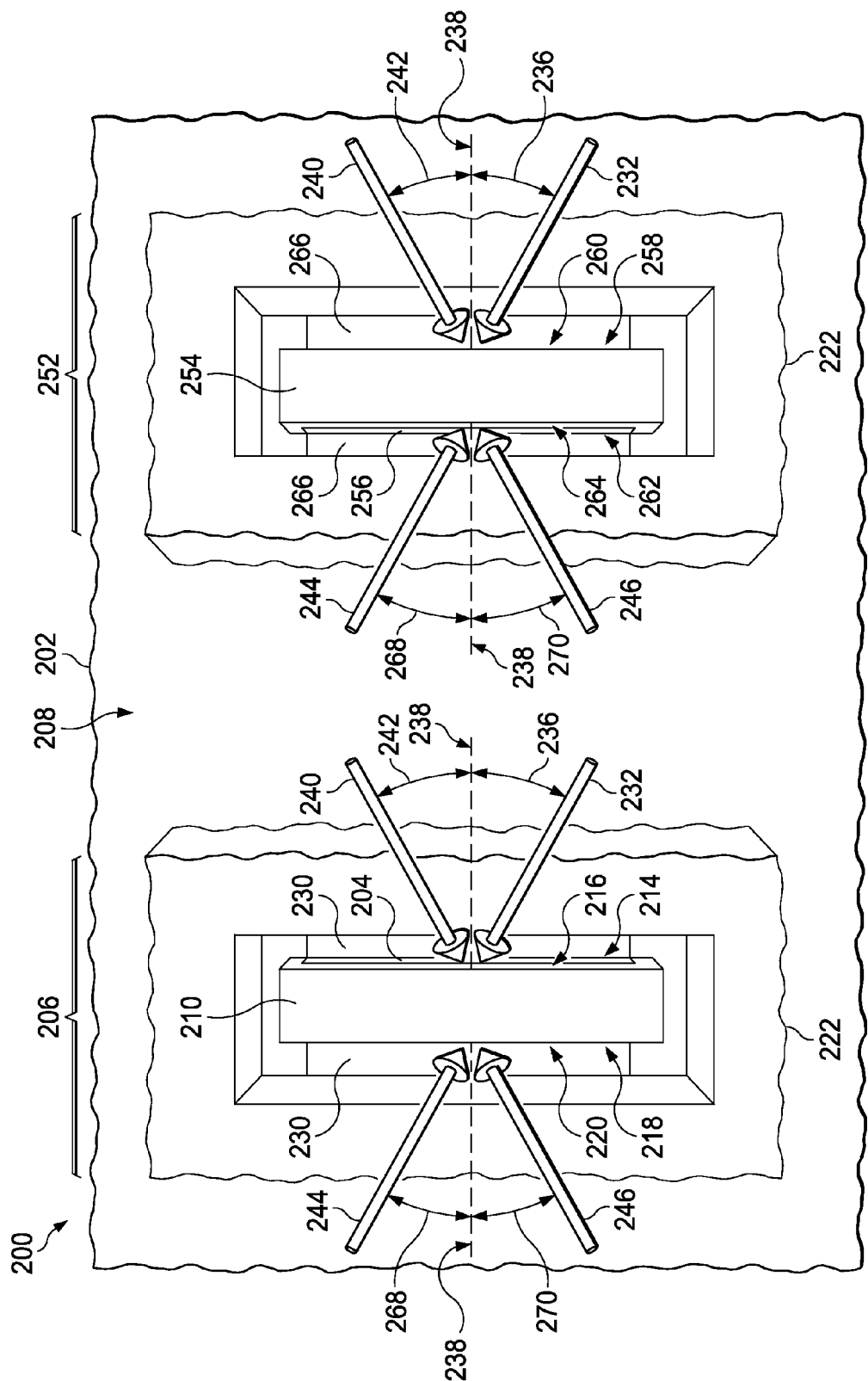
FIG. 2 is a top view of an integrated circuit containing a first analog MOS transistor and a second analog MOS transistor which are parallel to each other, during an implant process to form drain extensions.

FIG. 2 is a top view of an integrated circuit containing a first analog MOS transistor and a second analog MOS transistor which are parallel to each other, during an implant process to form drain extensions. The integrated circuit 200 is formed on a substrate 202 which includes semiconductor material at a top surface 208 of the substrate 202. The first analog MOS transistor 206 includes a first gate 210 formed over a first gate dielectric layer 204. The first analog MOS transistor 206 has a first source/drain gate edge 214 at the top surface 208 of the substrate 202 directly under a first lateral surface 216 of the first gate 210. The first analog MOS transistor 206 has a second source/drain gate edge 218 at the top surface 208 of the substrate 202 directly under a second lateral surface 220 of the first gate 210. The first source/drain gate edge 214 and the second source/drain gate edge 218 are on opposite sides of the first gate 210; the second source/drain gate edge 218 and the second lateral surface 220 of the first gate 210 are blocked from view in FIG. 2 by a top surface of the first gate 210.

The second analog MOS transistor 252 includes a second gate 254 formed over a second gate dielectric layer 256. The second analog MOS transistor 252 has a first source/drain gate edge 258 at the top surface 208 of the substrate 202 directly under a first lateral surface 260 of the second gate 254. The second analog MOS transistor 252 has a second source/drain gate edge 262 at the top surface 208 of the substrate 202 directly under a second lateral surface 264 of the second gate 254. The first source/drain gate edge 258 and the second source/drain gate edge 262 are on opposite sides of the second gate 254; the first source/drain gate edge 258 and the first lateral surface 260 of the second gate 254 are blocked from view in FIG. 2 by a top surface of the second gate 254. The first source/drain gate edge 258 and the second source/drain gate edge 262 of the second analog MOS transistor 252 are substantially parallel to the first source/drain gate edge 214 and the second source/drain gate edge 218 of the first analog MOS transistor 206.

An implant mask 222 is formed over the substrate 202 so as to expose at least a portion of the first gate 210 and expose a portion of the substrate 202 adjacent to the first gate 210. The implant mask 222 is separated from the first source/drain gate edge 214 and the second source/drain gate edge 218 of the first analog MOS transistor 206 by substantially equal lateral spaces. The height of the implant mask 222 and the lateral spaces may be such that implants with zero twist and at a tilt angle of 30 degrees, referenced to a perpendicular line to the top surface 208 of the substrate 202, would be blocked by the implant mask 222 from reaching the first source/drain gate edge 214 and the second source/drain gate edge 218. Similarly, the implant mask 222 exposes at least a portion of the second gate 254 and a portion of the substrate 202 adjacent to the second gate 254. The implant mask 222 is separated from the first source/drain gate edge 258 and the second source/drain gate edge 262 of the second analog MOS transistor 252 by substantially equal lateral spaces, which are also substantially equal to the lateral spaces separating the implant mask 222 from the first source/drain gate edge 214 and the second source/drain gate edge 218 of the first analog MOS transistor 206.

First drain extensions 230 are formed in the substrate 202 adjacent to, and partially underlapping, the first gate 210 and second drain extensions 266 are formed in the substrate 202 adjacent to, and partially underlapping, the second gate 254 by implanting dopants in exactly four sub-implants. A first sub-implant 232 of the four sub-implants puts a portion the dopants into the substrate 202 at the first source/drain gate edge 214 of the first analog MOS transistor 206 and the first source/drain gate edge 258 of the second analog MOS transistor 252. The first sub-implant 232 is at a tilt angle of at least 15 degrees referenced to the perpendicular line to the top surface 208 of the substrate 202, and at a first twist angle 236 having a magnitude of 5 degrees to 40 degrees referenced to horizontal normal lines 238. The horizontal normal lines 238 lie in the top surface 208 and are perpendicular to the first source/drain gate edge 214 and the second source/drain gate edge 218 of the first analog MOS transistor 206 and the first source/drain gate edge 258 and the second source/drain gate edge 262 of the second analog MOS transistor 252. The first twist angle 236 may be selected to advantageously provide higher CHC reliability for the first analog MOS transistor 206 and the second analog MOS transistor 252 compared to a sub-implant with a twist angle of 45 degrees. The first sub-implant 232 is blocked from the substrate 202 at the second source/drain gate edge 218 of the first analog MOS transistor 206 by the first gate 210, and the first sub-implant 232 is blocked from the substrate 202 at the second source/drain gate edge 262 of the second analog MOS transistor 252 by the second gate 254.

A second sub-implant 240 of the four sub-implants also implants a portion the dopants into the substrate 202 at the first source/drain gate edge 214 of the first analog MOS transistor 206 and at the first source/drain gate edge 258 of the second analog MOS transistor 252. The second sub-implant 240 is at the same tilt angle as the first sub-implant 232 referenced to the perpendicular line to the top surface 208 of the substrate 202, and at a second twist angle 242 referenced to the horizontal normal lines 238. The second twist angle 242 is opposite from the first twist angle 236 across the horizontal normal lines 238. The magnitude of the second twist angle 242 is substantially equal to the magnitude of the first twist angle 236. The second sub-implant 240 also clears the implant mask 222 to implant a desired amount of dopants into the substrate 202 at the first source/drain gate edge 214 of the first analog MOS transistor 206 and the first source/drain gate edge 258 of the second analog MOS transistor 252. The second sub-implant 240 is blocked from the substrate 202 at the second source/drain gate edge 218 of the first analog MOS transistor 206 by the first gate 210, and the second sub-implant 240 is blocked from the substrate 202 at the second source/drain gate edge 262 of the second analog MOS transistor 252 by the second gate 254.

A third sub-implant 244 of the four sub-implants implants a portion the dopants into the substrate 202 at the second source/drain gate edge 218 of the first analog MOS transistor 206 and at the second source/drain gate edge 262 of the second analog MOS transistor 252. The third sub-implant 244 is at the same tilt angle as the first sub-implant 232 referenced to the perpendicular line to the top surface 208 of the substrate 202, and at a third twist angle 268 referenced to the horizontal normal lines 238. The third twist angle 268 is 180 degrees from the first twist angle 236 so that the third sub-implant 244 is opposite from the first sub-implant 232, and a magnitude of the third twist angle 268 is substantially equal to the magnitude of the first twist angle 236. The third sub-implant 244 clears the implant mask 222 to implant a desired amount of dopants into the substrate 202 at the second source/drain gate edge 218 of the first analog MOS transistor 206 and the second source/drain gate edge 262 of the second analog MOS transistor 252. The third sub-implant 244 is blocked from the substrate 202 at the first source/drain gate edge 214 of the first analog MOS transistor 206 by the first gate 210, and the third sub-implant 244 is blocked from the substrate 202 at the first source/drain gate edge 258 of the second analog MOS transistor 252 by the second gate 254.

A fourth sub-implant 246 of the four sub-implants implants a portion the dopants into the substrate 202 at the second source/drain gate edge 218 of the first analog MOS transistor 206 and at the second source/drain gate edge 262 of the second analog MOS transistor 252. The fourth sub-implant 246 is at the same tilt angle as the first sub-implant 232 referenced to the perpendicular line to the top surface 208 of the substrate 202, and at a fourth twist angle 270 referenced to the horizontal normal lines 238. The fourth twist angle 270 is opposite from the third twist angle 268 across the horizontal normal lines 238, and the fourth twist angle 270 is 180 degrees from the second twist angle 242 so that the fourth sub-implant 246 is opposite from the second sub-implant 240. The magnitude of the fourth twist angle 270 is substantially equal to the magnitude of the first twist angle 236. The fourth sub-implant 246 clears the implant mask 222 to implant a desired amount of dopants into the substrate 202 at the second source/drain gate edge 218 of the first analog MOS transistor 206 and the second source/drain gate edge 262 of the second analog MOS transistor 252. The fourth sub-implant 246 is blocked from the substrate 202 at the first source/drain gate edge 214 of the first analog MOS transistor 206 by the first gate 210, and the third sub-implant 244 is blocked from the substrate 202 at the first source/drain gate edge 258 of the second analog MOS transistor 252 by the second gate 254.

The tilt angle is selected so that the first sub-implant 232 clears the implant mask 222 to implant a desired amount of dopants into the substrate 202 at the first source/drain gate edge 214 of the first analog MOS transistor 206 and the first source/drain gate edge 258 of the second analog MOS transistor 252, so that the second sub-implant 240 clears the implant mask 222 to implant a desired amount of dopants into the substrate 202 at the first source/drain gate edge 214 of the first analog MOS transistor 206 and the first source/drain gate edge 258 of the second analog MOS transistor 252, so that the third sub-implant 244 clears the implant mask 222 to implant a desired amount of dopants into the substrate 202 at the second source/drain gate edge 218 of the first analog MOS transistor 206 and the second source/drain gate edge 262 of the second analog MOS transistor 252, and so that the fourth sub-implant 246 clears the implant mask 222 to implant a desired amount of dopants into the substrate 202 at the second source/drain gate edge 218 of the first analog MOS transistor 206 and the second source/drain gate edge 262 of the second analog MOS transistor 252. Performing the four sub-implants 232, 240, 244 and 246 at twist angles having a magnitude of 5 degrees to 40 degrees may advantageously provide improved CHC reliability for the first analog MOS transistor 206 and the second analog MOS transistor 252 compared to performing four sub-implants at twist angles of 45 degrees. In one version of the instant example, doses of the four sub-implants 232, 240, 244 and 246 may be substantially equal. In an alternate version, doses of the first sub-implant 232 and the second sub-implant 240 may be substantially equal to each other, and doses of the third sub-implant 244 and the fourth sub-implant 246 may be substantially equal to each other, and the doses of the first sub-implant 232 and the second sub-implant 240 may be different from the doses of the third sub-implant 244 and the fourth sub-implant 246 by at least 10 percent.

Figure 3:
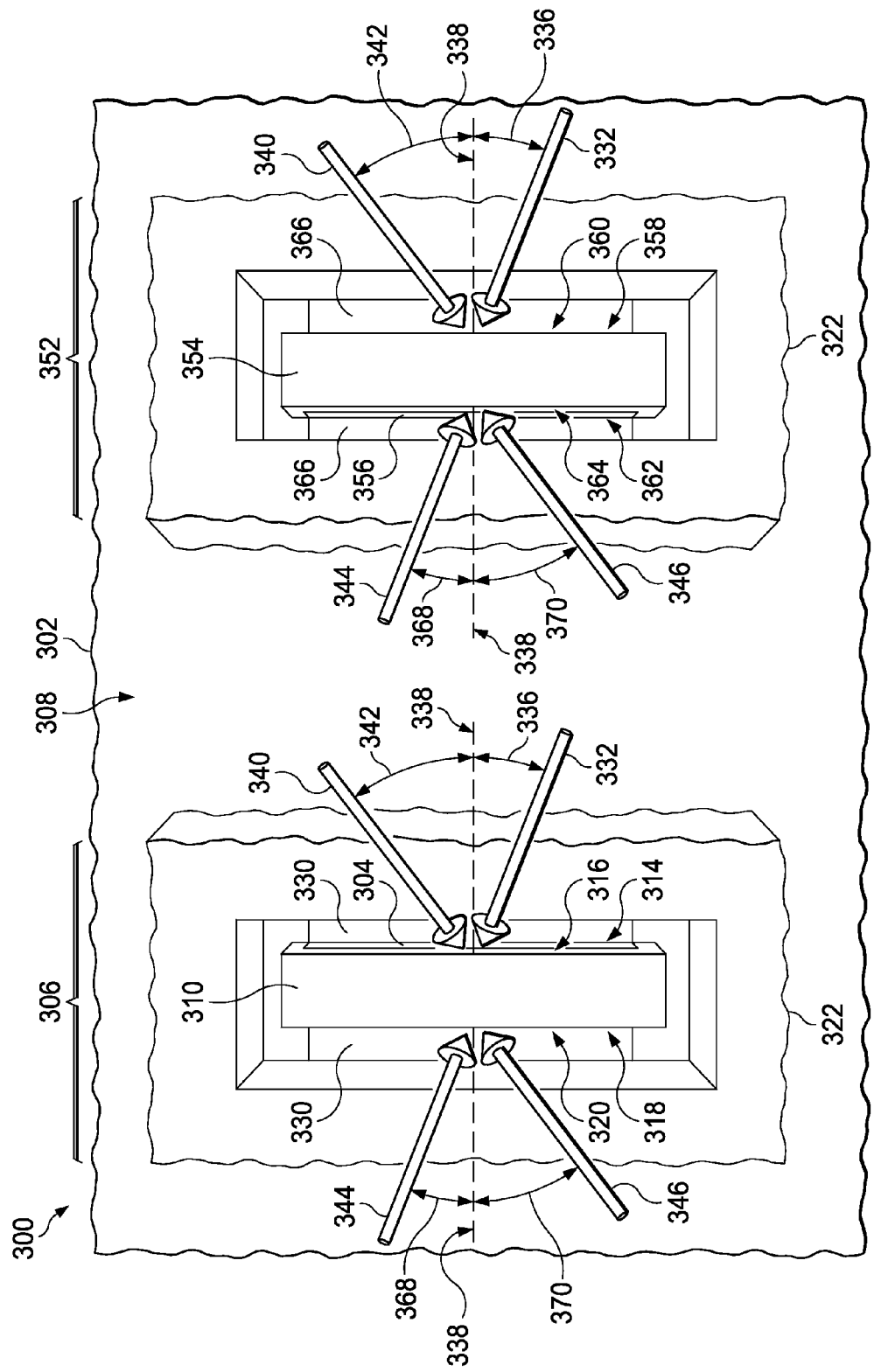
FIG. 3 is a top view of an integrated circuit containing a first analog MOS transistor and a second analog MOS transistor which are parallel to each other, during an implant process to form drain extensions.

FIG. 3 is a top view of an integrated circuit containing a first analog MOS transistor and a second analog MOS transistor which are parallel to each other, during an implant process to form drain extensions. The integrated circuit 300 is formed on a substrate 302 which includes semiconductor material at a top surface 308 of the substrate 302. The first analog MOS transistor 306 includes a first gate 310 formed over a first gate dielectric layer 304. The first analog MOS transistor 306 has a first source/drain gate edge 314 at the top surface 308 of the substrate 302 directly under a first lateral surface 316 of the first gate 310. The first analog MOS transistor 306 has a second source/drain gate edge 318 at the top surface 308 of the substrate 302 directly under a second lateral surface 320 of the first gate 310. The first source/drain gate edge 314 and the second source/drain gate edge 318 are on opposite sides of the first gate 310; the second source/drain gate edge 318 and the second lateral surface 320 of the first gate 310 are blocked from view in FIG. 3 by a top surface of the first gate 310.

The second analog MOS transistor 352 includes a second gate 354 formed over a second gate dielectric layer 356. The second analog MOS transistor 352 has a first source/drain gate edge 358 at the top surface 308 of the substrate 302 directly under a first lateral surface 360 of the second gate 354. The second analog MOS transistor 352 has a second source/drain gate edge 362 at the top surface 308 of the substrate 302 directly under a second lateral surface 364 of the second gate 354. The first source/drain gate edge 358 and the second source/drain gate edge 362 are on opposite sides of the second gate 354; the first source/drain gate edge 358 and the first lateral surface 360 of the second gate 354 are blocked from view in FIG. 3 by a top surface of the second gate 354. The first source/drain gate edge 358 and the second source/drain gate edge 362 of the second analog MOS transistor 352 are substantially parallel to the first source/drain gate edge 314 and the second source/drain gate edge 318 of the first analog MOS transistor 306.

An implant mask 322 is formed over the substrate 302 so as to expose at least a portion of the first gate 310 and expose a portion of the substrate 302 adjacent to the first gate 310. The implant mask 322 is separated from the first source/drain gate edge 314 and the second source/drain gate edge 318 of the first analog MOS transistor 306 by substantially equal lateral spaces. The height of the implant mask 322 and the lateral spaces may be such that implants with zero twist and at a tilt angle of 30 degrees, referenced to a perpendicular line to the top surface 308 of the substrate 302, would be blocked by the implant mask 322 from reaching the first source/drain gate edge 314 and the second source/drain gate edge 318. Similarly, the implant mask 322 exposes at least a portion of the second gate 354 and a portion of the substrate 302 adjacent to the second gate 354. The implant mask 322 is separated from the first source/drain gate edge 358 and the second source/drain gate edge 362 of the second analog MOS transistor 352 by substantially equal lateral spaces, which are also substantially equal to the lateral spaces separating the implant mask 322 from the first source/drain gate edge 314 and the second source/drain gate edge 318 of the first analog MOS transistor 306.

First drain extensions 330 are formed in the substrate 302 adjacent to, and partially underlapping, the first gate 310 and second drain extensions 366 are formed in the substrate 302 adjacent to, and partially underlapping, the second gate 354 by implanting dopants in exactly four sub-implants. A first sub-implant 332 of the four sub-implants puts a portion the dopants into the substrate 302 at the first source/drain gate edge 314 of the first analog MOS transistor 306 and the first source/drain gate edge 358 of the second analog MOS transistor 352. The first sub-implant 332 is at a tilt angle of at least 15 degrees referenced to the perpendicular line to the top surface 308 of the substrate 302, and at a first twist angle 336 having a magnitude of 5 degrees to 40 degrees referenced to horizontal normal lines 338. The horizontal normal lines 338 lie in the top surface 308 and are perpendicular to the first source/drain gate edge 314 and the second source/ drain gate edge 318 of the first analog MOS transistor 306 and the first source/drain gate edge 358 and the second source/drain gate edge 362 of the second analog MOS transistor 352. The first twist angle 336 may be selected to advantageously provide higher CHC reliability for the first analog MOS transistor 306 and the second analog MOS transistor 352 compared to a sub-implant with a twist angle of 45 degrees. The first sub-implant 332 is blocked from the substrate 302 at the second source/drain gate edge 318 of the first analog MOS transistor 306 by the first gate 310, and the first sub-implant 332 is blocked from the substrate 302 at the second source/drain gate edge 362 of the second analog MOS transistor 352 by the second gate 354.

A second sub-implant 340 of the four sub-implants also implants a portion the dopants into the substrate 302 at the first source/drain gate edge 314 of the first analog MOS transistor 306 and at the first source/drain gate edge 358 of the second analog MOS transistor 352. The second sub-implant 340 is at the same tilt angle as the first sub-implant 332 referenced to the perpendicular line to the top surface 308 of the substrate 302, and at a second twist angle 342 having a magnitude of 5 degrees to 40 degrees referenced to the horizontal normal lines 338. The second twist angle 342 is opposite from the first twist angle 336 across the horizontal normal lines 338. The magnitude of the second twist angle 342 is greater than a magnitude of the first twist angle 336 by at least 10 degrees. The second sub-implant 340 also clears the implant mask 322 to implant a desired amount of dopants into the substrate 302 at the first source/drain gate edge 314 of the first analog MOS transistor 306 and the first source/drain gate edge 358 of the second analog MOS transistor 352. The second sub-implant 340 is blocked from the substrate 302 at the second source/drain gate edge 318 of the first analog MOS transistor 306 by the first gate 310, and the second sub-implant 340 is blocked from the substrate 302 at the second source/drain gate edge 362 of the second analog MOS transistor 352 by the second gate 354.

A third sub-implant 344 of the four sub-implants implants a portion the dopants into the substrate 302 at the second source/drain gate edge 318 of the first analog MOS transistor 306 and at the second source/drain gate edge 362 of the second analog MOS transistor 352. The third sub-implant 344 is at the same tilt angle as the first sub-implant 332 referenced to the perpendicular line to the top surface 308 of the substrate 302, and at a third twist angle 368 referenced to the horizontal normal lines 338. The third twist angle 368 is 180 degrees from the first twist angle 336 so that the third sub-implant 344 is opposite from the first sub-implant 332 and the third twist angle 368 has a magnitude substantially equal to the magnitude of the first twist angle 336. The third sub-implant 344 clears the implant mask 322 to implant a desired amount of dopants into the substrate 302 at the second source/drain gate edge 318 of the first analog MOS transistor 306 and the second source/drain gate edge 362 of the second analog MOS transistor 352. The third sub-implant 344 is blocked from the substrate 302 at the first source/drain gate edge 314 of the first analog MOS transistor 306 by the first gate 310, and the third sub-implant 344 is blocked from the substrate 302 at the first source/drain gate edge 358 of the second analog MOS transistor 352 by the second gate 354.

A fourth sub-implant 346 of the four sub-implants implants a portion the dopants into the substrate 302 at the second source/drain gate edge 318 of the first analog MOS transistor 306 and the second source/drain gate edge 362 of the second analog MOS transistor 352. The fourth sub-implant 346 is at the same tilt angle as the first sub-implant 332 referenced to the perpendicular line to the top surface 308 of the substrate 302, and at a fourth twist angle 370 referenced to the horizontal normal lines 338. The fourth twist angle 370 is opposite from the third twist angle 368 across the horizontal normal lines 338. The fourth twist angle 370 is 180 degrees from the second twist angle 342 so that the fourth sub-implant 346 is opposite from the second sub-implant 340, and the fourth sub-implant 346 has a magnitude substantially equal to the magnitude of the second twist angle 342. The fourth sub-implant 346 clears the implant mask 322 to implant a desired amount of dopants into the substrate 302 at the second source/drain gate edge 318 of the first analog MOS transistor 306 and the second source/drain gate edge 362 of the second analog MOS transistor 352. The fourth sub-implant 346 is blocked from the substrate 302 at the first source/drain gate edge 314 of the first analog MOS transistor 306 by the first gate 310, and the third sub-implant 344 is blocked from the substrate 302 at the first source/drain gate edge 358 of the second analog MOS transistor 352 by the second gate 354.

The tilt angle is selected so that the first sub-implant 332 clears the implant mask 322 to implant a desired amount of dopants into the substrate 302 at the first source/drain gate edge 314 of the first analog MOS transistor 306 and the first source/drain gate edge 358 of the second analog MOS transistor 352, so that the second sub-implant 340 clears the implant mask 322 to implant a desired amount of dopants into the substrate 302 at the first source/drain gate edge 314 of the first analog MOS transistor 306 and the first source/drain gate edge 358 of the second analog MOS transistor 352, so that the third sub-implant 344 clears the implant mask 322 to implant a desired amount of dopants into the substrate 302 at the second source/drain gate edge 318 of the first analog MOS transistor 306 and the second source/drain gate edge 362 of the second analog MOS transistor 352, and so that the fourth sub-implant 346 clears the implant mask 322 to implant a desired amount of dopants into the substrate 302 at the second source/drain gate edge 318 of the first analog MOS transistor 306 and the second source/drain gate edge 362 of the second analog MOS transistor 352. Performing the four sub-implants 332, 340, 344 and 346 at twist angles having a magnitude of 5 degrees to 40 degrees may advantageously provide improved CHC reliability for the first analog MOS transistor 306 and the second analog MOS transistor 352 compared to performing four sub-implants at twist angles of 45 degrees. In one version of the instant example, doses of the four sub-implants 332, 340, 344 and 346 may be substantially equal. In an alternate version, doses of the first sub-implant 332 and the second sub-implant 340 may be substantially equal to each other, and doses of the third sub-implant 344 and the fourth sub-implant 346 may be substantially equal to each other, and the doses of the first sub-implant 332 and the second sub-implant 340 may be different from the doses of the third sub-implant 344 and the fourth sub-implant 346 by at least 10 percent. In a further version, doses of the four sub-implants 332, 340, 344 and 346 may be different from each other by at least 10 percent.

Figure 4:
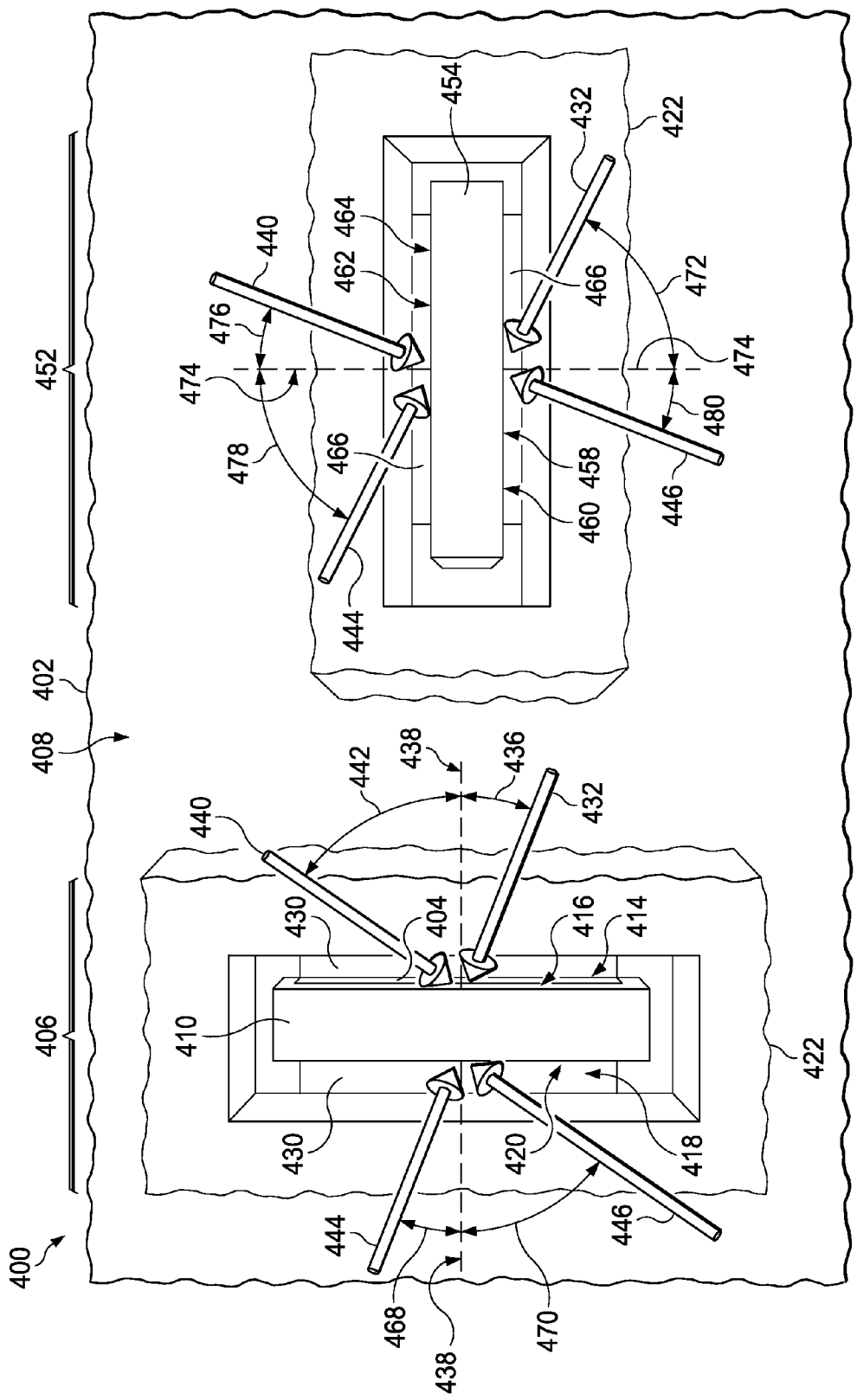
FIG. 4 is a top view of an integrated circuit containing a first analog MOS transistor and a second analog MOS transistor which are perpendicular to each other, during an implant process to form drain extensions.

FIG. 4 is a top view of an integrated circuit containing a first analog MOS transistor and a second analog MOS transistor which are perpendicular to each other, during an implant process to form drain extensions. The integrated circuit 400 is formed on a substrate 402 which includes semiconductor material at a top surface 408 of the substrate 402. The first analog MOS transistor 406 includes a first gate 410 formed over a first gate dielectric layer 404. The first analog MOS transistor 406 has a first source/drain gate edge 414 at the top surface 408 of the substrate 402 directly under a first lateral surface 416 of the first gate 410. The first analog MOS transistor 406 has a second source/drain gate edge 418 at the top surface 408 of the substrate 402 directly under a second lateral surface 420 of the first gate 410. The first source/drain gate edge 414 and the second source/drain gate edge 418 are on opposite sides of the first gate 410; the second source/drain gate edge 418 and the second lateral surface 420 of the first gate 410 are blocked from view in FIG. 4 by a top surface of the first gate 410.

The second analog MOS transistor 452 includes a second gate 454 formed over a second gate dielectric layer which is blocked from view in FIG. 4 by the second gate 454. The second analog MOS transistor 452 has a first source/drain gate edge 458 at the top surface 408 of the substrate 402 directly under a first lateral surface 460 of the second gate 454. The second analog MOS transistor 452 has a second source/drain gate edge 462 at the top surface 408 of the substrate 402 directly under a second lateral surface 464 of the second gate 454. The first source/drain gate edge 458 and the second source/drain gate edge 462 are on opposite sides of the second gate 454. The first source/drain gate edge 458, the first lateral surface 460 of the second gate 454, the second source/drain gate edge 462 and the second lateral surface 464 are blocked from view in FIG. 4 by a top surface of the second gate 454. The first source/drain gate edge 458 and the second source/drain gate edge 462 of the second analog MOS transistor 452 are substantially perpendicular to the first source/drain gate edge 414 and the second source/drain gate edge 418 of the first analog MOS transistor 406.

An implant mask 422 is formed over the substrate 402 so as to expose at least a portion of the first gate 410 and expose a portion of the substrate 402 adjacent to the first gate 410. The implant mask 422 is separated from the first source/drain gate edge 414 and the second source/drain gate edge 418 of the first analog MOS transistor 406 by substantially equal lateral spaces. The height of the implant mask 422 and the lateral spaces may be such that implants with zero twist and at a tilt angle of 30 degrees, referenced to a perpendicular line to the top surface 408 of the substrate 402, would be blocked by the implant mask 422 from reaching the first source/drain gate edge 414 and the second source/drain gate edge 418. Similarly, the implant mask 422 exposes at least a portion of the second gate 454 and a portion of the substrate 402 adjacent to the second gate 454. The implant mask 422 is separated from the first source/drain gate edge 458 and the second source/drain gate edge 462 of the second analog MOS transistor 452 by substantially equal lateral spaces, which are also substantially equal to the lateral spaces separating the implant mask 422 from the first source/drain gate edge 414 and the second source/drain gate edge 418 of the first analog MOS transistor 406.

First drain extensions 430 are formed in the substrate 402 adjacent to, and partially underlapping, the first gate 410 and second drain extensions 466 are formed in the substrate 402 adjacent to, and partially underlapping, the second gate 454 by implanting dopants in exactly four sub-implants. A first sub-implant 432 of the four sub-implants puts a portion the dopants into the substrate 402 at the first source/drain gate edge 414 of the first analog MOS transistor 406 and the first source/drain gate edge 458 of the second analog MOS transistor 452. The first sub-implant 432 is at a tilt angle of at least 15 degrees referenced to the perpendicular line to the top surface 408 of the substrate 402. The first sub-implant 432 is at a first twist angle 436 having a magnitude of 5 degrees to 40 degrees referenced to first horizontal normal lines 438. The first horizontal normal lines 438 lie in the top surface 408 and are perpendicular to the first source/drain gate edge 414 and the second source/drain gate edge 418 of the first analog MOS transistor 406. The first sub-implant 432 is at a fifth twist angle 472 having a magnitude of 50 degrees to 85 degrees referenced to second horizontal normal lines 474. The second horizontal normal lines 474 lie in the top surface 408 and are perpendicular to the first source/drain gate edge 458 and the second source/drain gate edge 462 of the second analog MOS transistor 452. The first twist angle 436 may be selected to advantageously provide higher CHC reliability for the first analog MOS transistor 406 compared to a sub-implant with a twist angle of 45 degrees. The first sub-implant 432 is blocked from the substrate 402 at the second source/drain gate edge 418 of the first analog MOS transistor 406 by the first gate 410, and the first sub-implant 432 is blocked from the substrate 402 at the second source/drain gate edge 462 of the second analog MOS transistor 452 by the second gate 454.

A second sub-implant 440 of the four sub-implants implants a portion of the dopants into the substrate 402 at the first source/drain gate edge 414 of the first analog MOS transistor 406 and at the second source/drain gate edge 462 of the second analog MOS transistor 452. The second sub-implant 440 is at the same tilt angle as the first sub-implant 432 referenced to the perpendicular line to the top surface 408 of the substrate 402. The second sub-implant 440 is at a second twist angle 442 having a magnitude of 50 degrees to 85 degrees referenced to the first horizontal normal lines 438. The second twist angle 442 is opposite from the first twist angle 436 across the first horizontal normal lines 438. In the instant example, the second twist angle 442 is substantially 90 degrees from the first twist angle 436. The second sub-implant 440 is at a sixth twist angle 476 referenced to the second horizontal normal lines 474. The sixth twist angle 476 is substantially 90 degrees from the fifth twist angle 572. The second sub-implant 440 also clears the implant mask 422 to implant a desired amount of dopants into the substrate 402 at the first source/drain gate edge 414 of the first analog MOS transistor 406 and the second source/drain gate edge 462 of the second analog MOS transistor 452. The second sub-implant 440 is blocked from the substrate 402 at the second source/drain gate edge 418 of the first analog MOS transistor 406 by the first gate 410, and the second sub-implant 440 is blocked from the substrate 402 at the first source/drain gate edge 458 of the second analog MOS transistor 452 by the second gate 454.

A third sub-implant 444 of the four sub-implants implants a portion of the dopants into the substrate 402 at the second source/drain gate edge 418 of the first analog MOS transistor 406 and at the second source/drain gate edge 462 of the second analog MOS transistor 452. The third sub-implant 444 is at the same tilt angle as the first sub-implant 432 referenced to the perpendicular line to the top surface 408 of the substrate 402. The third sub-implant 444 is at a third twist angle 468 referenced to the first horizontal normal lines 438, and is at a seventh twist angle 478 referenced to the second horizontal normal lines 474. The third twist angle 468 has a magnitude substantially equal to the magnitude of the first twist angle 436 so that the third twist angle 468 is 180 degrees from the first twist angle 436, and the seventh twist angle 478 has a magnitude substantially equal to the magnitude of the fifth twist angle 436, so that the seventh twist angle 478 is 180 degrees from the fifth twist angle 436. The third sub-implant 444 is opposite from the first sub-implant 432. The third sub-implant 444 clears the implant mask 422 to implant a desired amount of dopants into the substrate 402 at the second source/drain gate edge 418 of the first analog MOS transistor 406 and the second source/drain gate edge 462 of the second analog MOS transistor 452. The third sub-implant 444 is blocked from the substrate 402 at the first source/drain gate edge 414 of the first analog MOS transistor 406 by the first gate 410, and the third sub-implant 444 is blocked from the substrate 402 at the first source/drain gate edge 458 of the second analog MOS transistor 452 by the second gate 454.

A fourth sub-implant 446 of the four sub-implants implants a portion the dopants into the substrate 402 at the second source/drain gate edge 418 of the first analog MOS transistor 406 and at the first source/drain gate edge 458 of the second analog MOS transistor 452. The fourth sub-implant 446 is at the same tilt angle as the first sub-implant 432 referenced to the perpendicular line to the top surface 408 of the substrate 402. The fourth sub-implant 446 is at a fourth twist angle 470 referenced to the first horizontal normal lines 438, and is an eighth twist angle 480 referenced to the second horizontal normal lines 474. The fourth twist angle 470 has a magnitude substantially equal to the magnitude of the second twist angle 442 so that the fourth twist angle 470 is 180 degrees from the second twist angle 442, and the eighth twist angle 480 has a magnitude substantially equal to the magnitude of the sixth twist angle 476 so that the eighth twist angle 480 is 180 degrees from the sixth twist angle 476. The fourth sub-implant 446 is opposite from the second sub-implant 440. The fourth twist angle 470 is 90 degrees from the third twist angle 468 and the eighth twist angle 480 is 90 degrees from the seventh twist angle 478. The fourth sub-implant 446 clears the implant mask 422 to implant a desired amount of dopants into the substrate 402 at the second source/drain gate edge 418 of the first analog MOS transistor 406 and the second source/drain gate edge 462 of the second analog MOS transistor 452. The fourth sub-implant 446 is blocked from the substrate 402 at the first source/drain gate edge 414 of the first analog MOS transistor 406 by the first gate 410, and the fourth sub-implant 446 is blocked from the substrate 402 at the second source/drain gate edge 462 of the second analog MOS transistor 452 by the second gate 454.

The tilt angle is selected so that the first sub-implant 432 clears the implant mask 422 to implant a desired amount of dopants into the substrate 402 at the first source/drain gate edge 414 of the first analog MOS transistor 406 and the first source/drain gate edge 458 of the second analog MOS transistor 452, so that the second sub-implant 440 clears the implant mask 422 to implant a desired amount of dopants into the substrate 402 at the first source/drain gate edge 414 of the first analog MOS transistor 406 and the first source/drain gate edge 458 of the second analog MOS transistor 452, so that the third sub-implant 444 clears the implant mask 422 to implant a desired amount of dopants into the substrate 402 at the second source/drain gate edge 418 of the first analog MOS transistor 406 and the second source/drain gate edge 462 of the second analog MOS transistor 452, and so that the fourth sub-implant 446 clears the implant mask 422 to implant a desired amount of dopants into the substrate 402 at the second source/drain gate edge 418 of the first analog MOS transistor 406 and the second source/drain gate edge 462 of the second analog MOS transistor 452. Performing the sub-implants 432, 440, 444 and 446 at twist angles having a magnitude of 5 degrees to 40 degrees reference to horizontal perpendicular lines to the corresponding source/drain gate edges 414, 418, 458 and 462 may advantageously provide improved CHC reliability for the first analog MOS transistor 406 and the second analog MOS transistor 452 compared to performing four sub-implants at twist angles of 45 degrees. Performing the first sub-implant 432 and second sub-implant 440 with twist angles 90 degrees apart, and performing the third sub-implant 444 and the fourth sub-implant 446 with twist angles 90 degrees apart may advantageously provide substantially equal dopant distributions in the first drain extensions 430 and the second drain extensions 466, which may be desired for instances of the first analog MOS transistor 406 and the second analog MOS transistor 452 which are matched transistors. In one version of the instant example, doses of the four sub-implants 432, 440, 444 and 446 may be substantially equal. In an alternate version, doses of the first sub-implant 432 and the second sub-implant 440 may be substantially equal to each other, and doses of the third sub-implant 444 and the fourth sub-implant 446 may be substantially equal to each other, and the doses of the first sub-implant 432 and the second sub-implant 440 may be different from the doses of the third sub-implant 444 and the fourth sub-implant 446 by at least 10 percent. In a further version, doses of the four sub-implants 432, 440, 444 and 446 may be different from each other by at least 10 percent.

Figure 5:
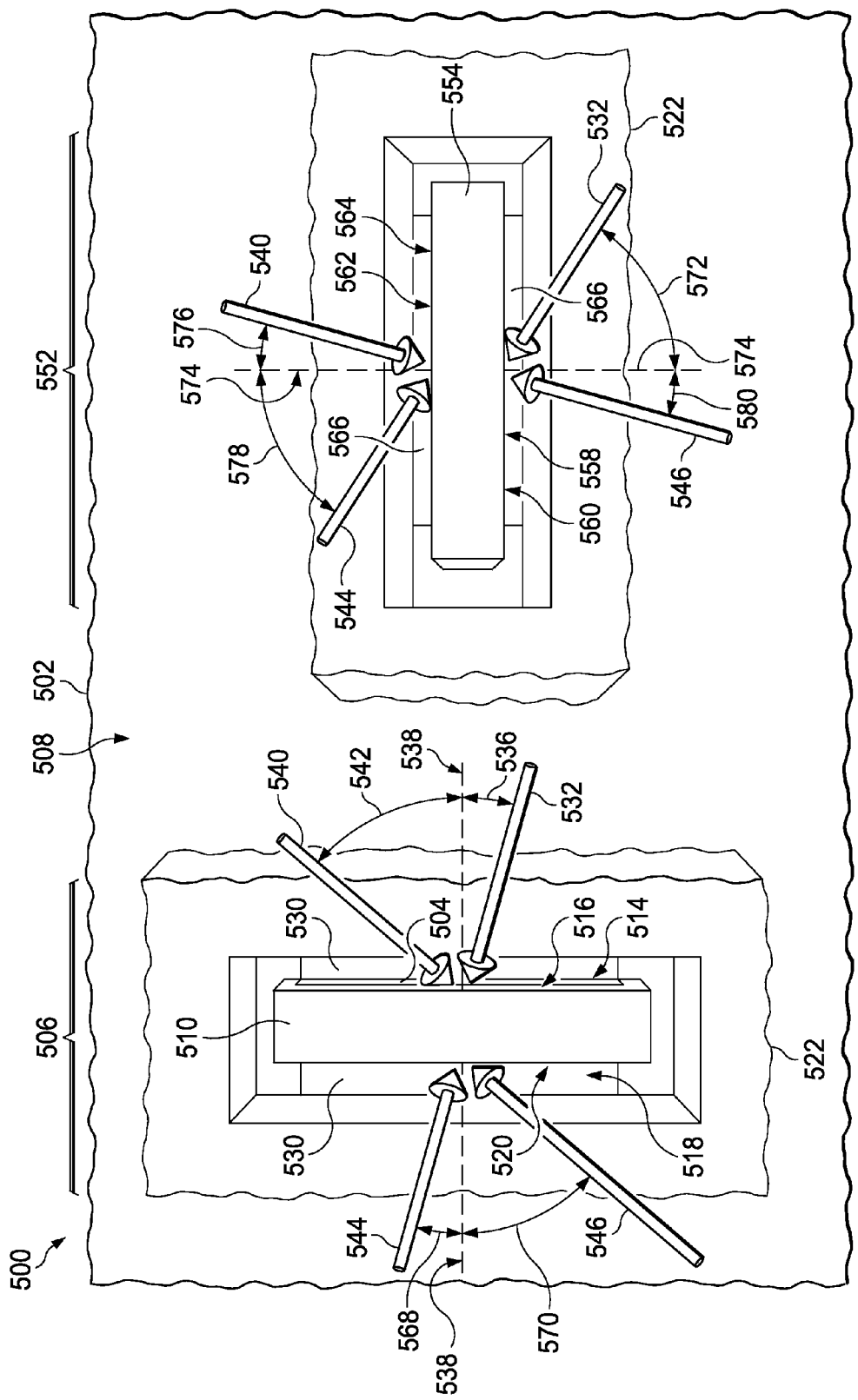
FIG. 5 is a top view of an integrated circuit containing a first analog MOS transistor and a second analog MOS transistor which are perpendicular to each other, during an implant process to form drain extensions.

FIG. 5 is a top view of an integrated circuit containing a first analog MOS transistor and a second analog MOS transistor which are perpendicular to each other, during an implant process to form drain extensions. The integrated circuit 500 is formed on a substrate 502 which includes semiconductor material at a top surface 508 of the substrate 502. The first analog MOS transistor 506 includes a first gate 510 formed over a first gate dielectric layer 504. The first analog MOS transistor 506 has a first source/drain gate edge 514 at the top surface 508 of the substrate 502 directly under a first lateral surface 516 of the first gate 510. The first analog MOS transistor 506 has a second source/drain gate edge 518 at the top surface 508 of the substrate 502 directly under a second lateral surface 520 of the first gate 510. The first source/drain gate edge 514 and the second source/drain gate edge 518 are on opposite sides of the first gate 510; the second source/drain gate edge 518 and the second lateral surface 520 of the first gate 510 are blocked from view in FIG. 5 by a top surface of the first gate 510.

The second analog MOS transistor 552 includes a second gate 554 formed over a second gate dielectric layer which is blocked from view in FIG. 5 by the second gate 554. The second analog MOS transistor 552 has a first source/drain gate edge 558 at the top surface 508 of the substrate 502 directly under a first lateral surface 560 of the second gate 554. The second analog MOS transistor 552 has a second source/drain gate edge 562 at the top surface 508 of the substrate 502 directly under a second lateral surface 564 of the second gate 554. The first source/drain gate edge 558 and the second source/drain gate edge 562 are on opposite sides of the second gate 554. The first source/drain gate edge 558, the first lateral surface 560 of the second gate 554, the second source/drain gate edge 562 and the second lateral surface 564 are blocked from view in FIG. 5 by a top surface of the second gate 554. The first source/drain gate edge 558 and the second source/drain gate edge 562 of the second analog MOS transistor 552 are substantially perpendicular to the first source/drain gate edge 514 and the second source/drain gate edge 518 of the first analog MOS transistor 506.

An implant mask 522 is formed over the substrate 502 so as to expose at least a portion of the first gate 510 and expose a portion of the substrate 502 adjacent to the first gate 510. The implant mask 522 is separated from the first source/drain gate edge 514 and the second source/drain gate edge 518 of the first analog MOS transistor 506 by substantially equal lateral spaces. The height of the implant mask 522 and the lateral spaces may be such that implants with zero twist and at a tilt angle of 30 degrees, referenced to a perpendicular line to the top surface 508 of the substrate 502, would be blocked by the implant mask 522 from reaching the first source/drain gate edge 514 and the second source/drain gate edge 518. Similarly, the implant mask 522 exposes at least a portion of the second gate 554 and a portion of the substrate 502 adjacent to the second gate 554. The implant mask 522 is separated from the first source/drain gate edge 558 and the second source/drain gate edge 562 of the second analog MOS transistor 552 by substantially equal lateral spaces, which are also substantially equal to the lateral spaces separating the implant mask 522 from the first source/drain gate edge 514 and the second source/drain gate edge 518 of the first analog MOS transistor 506.

First drain extensions 530 are formed in the substrate 502 adjacent to, and partially underlapping, the first gate 510 and second drain extensions 566 are formed in the substrate 502 adjacent to, and partially underlapping, the second gate 554 by implanting dopants in exactly four sub-implants. A first sub-implant 532 of the four sub-implants puts a portion the dopants into the substrate 502 at the first source/drain gate edge 514 of the first analog MOS transistor 506 and the first source/drain gate edge 558 of the second analog MOS transistor 552. The first sub-implant 532 is at a tilt angle of at least 15 degrees referenced to the perpendicular line to the top surface 508 of the substrate 502. The first sub-implant 532 is at a first twist angle 536 having a magnitude of 5 degrees to 40 degrees referenced to first horizontal normal lines 538. The first horizontal normal lines 538 lie in the top surface 508 and are perpendicular to the first source/drain gate edge 514 and the second source/drain gate edge 518 of the first analog MOS transistor 506. The first sub-implant 532 is at a fifth twist angle 572 having a magnitude of 50 degrees to 85 degrees referenced to second horizontal normal lines 574. The second horizontal normal lines 574 lie in the top surface 508 and are perpendicular to the first source/drain gate edge 558 and the second source/drain gate edge 562 of the second analog MOS transistor 552. The first twist angle 536 may be selected to advantageously provide higher CHC reliability for the first analog MOS transistor 506 compared to a sub-implant with a twist angle of 45 degrees. The first sub-implant 532 is blocked from the substrate 502 at the second source/drain gate edge 518 of the first analog MOS transistor 506 by the first gate 510, and the first sub-implant 532 is blocked from the substrate 502 at the second source/drain gate edge 562 of the second analog MOS transistor 552 by the second gate 554.

A second sub-implant 540 of the four sub-implants implants a portion of the dopants into the substrate 502 at the first source/drain gate edge 514 of the first analog MOS transistor 506 and at the second source/drain gate edge 562 of the second analog MOS transistor 552. The second sub-implant 540 is at the same tilt angle as the first sub-implant 532 referenced to the perpendicular line to the top surface 508 of the substrate 502. The second sub-implant 540 is at a second twist angle 542 having a magnitude of 50 degrees to 85 degrees referenced to the first horizontal normal lines 538. The second twist angle 542 is opposite from the first twist angle 536 across the first horizontal normal lines 538. In the instant example, the second twist angle 542 is 55 degrees to 85 degrees from the first twist angle 536. The second sub-implant 540 is at a sixth twist angle 576 referenced to the second horizontal normal lines 574. The second sub-implant 540 also clears the implant mask 522 to implant a desired amount of dopants into the substrate 502 at the first source/drain gate edge 514 of the first analog MOS transistor 506 and the second source/drain gate edge 562 of the second analog MOS transistor 552. The second sub-implant 540 is blocked from the substrate 502 at the second source/drain gate edge 518 of the first analog MOS transistor 506 by the first gate 510, and the second sub-implant 540 is blocked from the substrate 502 at the first source/drain gate edge 558 of the second analog MOS transistor 552 by the second gate 554.

A third sub-implant 544 of the four sub-implants implants a portion of the dopants into the substrate 502 at the second source/drain gate edge 518 of the first analog MOS transistor 506 and at the second source/drain gate edge 562 of the second analog MOS transistor 552. The third sub-implant 544 is at the same tilt angle as the first sub-implant 532 referenced to the perpendicular line to the top surface 508 of the substrate 502. The third sub-implant 544 is at a third twist angle 568 referenced to the first horizontal normal lines 538, and is at a seventh twist angle 578 referenced to the second horizontal normal lines 574. The third twist angle 568 has a magnitude substantially equal to the magnitude of the first twist angle 536 so that the third twist angle 568 is 180 degrees from the first twist angle 536, and the seventh twist angle 578 has a magnitude substantially equal to the magnitude of the fifth twist angle 536, so that the seventh twist angle 578 is 180 degrees from the fifth twist angle 536. The third sub-implant 544 is opposite from the first sub-implant 532. The third sub-implant 544 clears the implant mask 522 to implant a desired amount of dopants into the substrate 502 at the second source/drain gate edge 518 of the first analog MOS transistor 506 and the second source/drain gate edge 562 of the second analog MOS transistor 552. The third sub-implant 544 is blocked from the substrate 502 at the first source/drain gate edge 514 of the first analog MOS transistor 506 by the first gate 510, and the third sub-implant 544 is blocked from the substrate 502 at the first source/drain gate edge 558 of the second analog MOS transistor 552 by the second gate 554.

A fourth sub-implant 546 of the four sub-implants implants a portion the dopants into the substrate 502 at the second source/drain gate edge 518 of the first analog MOS transistor 506 and at the first source/drain gate edge 558 of the second analog MOS transistor 552. The fourth sub-implant 546 is at the same tilt angle as the first sub-implant 532 referenced to the perpendicular line to the top surface 508 of the substrate 502. The fourth sub-implant 546 is at a fourth twist angle 570 referenced to the first horizontal normal lines 538, and is an eighth twist angle 580 referenced to the second horizontal normal lines 574. The fourth twist angle 570 has a magnitude substantially equal to the magnitude of the second twist angle 542 so that the fourth twist angle 570 is 180 degrees from the second twist angle 542, and the eighth twist angle 580 has a magnitude substantially equal to the magnitude of the sixth twist angle 576 so that the eighth twist angle 580 is 180 degrees from the sixth twist angle 576. The fourth sub-implant 546 is opposite from the second sub-implant 540. The fourth sub-implant 546 clears the implant mask 522 to implant a desired amount of dopants into the substrate 502 at the second source/drain gate edge 518 of the first analog MOS transistor 506 and the second source/drain gate edge 562 of the second analog MOS transistor 552. The fourth sub-implant 546 is blocked from the substrate 502 at the first source/drain gate edge 514 of the first analog MOS transistor 506 by the first gate 510, and the fourth sub-implant 546 is blocked from the substrate 502 at the second source/drain gate edge 562 of the second analog MOS transistor 552 by the second gate 554.

The tilt angle is selected so that the first sub-implant 532 clears the implant mask 522 to implant a desired amount of dopants into the substrate 502 at the first source/drain gate edge 514 of the first analog MOS transistor 506 and the first source/drain gate edge 558 of the second analog MOS transistor 552, so that the second sub-implant 540 clears the implant mask 522 to implant a desired amount of dopants into the substrate 502 at the first source/drain gate edge 514 of the first analog MOS transistor 506 and the first source/drain gate edge 558 of the second analog MOS transistor 552, so that the third sub-implant 544 clears the implant mask 522 to implant a desired amount of dopants into the substrate 502 at the second source/drain gate edge 518 of the first analog MOS transistor 506 and the second source/drain gate edge 562 of the second analog MOS transistor 552, and so that the fourth sub-implant 546 clears the implant mask 522 to implant a desired amount of dopants into the substrate 502 at the second source/drain gate edge 518 of the first analog MOS transistor 506 and the second source/drain gate edge 562 of the second analog MOS transistor 552. Performing the sub-implants 532, 540, 544 and 546 at twist angles having a magnitude of 5 degrees to 40 degrees reference to horizontal perpendicular lines to the corresponding source/drain gate edges 514, 518, 558 and 562 may advantageously provide improved CHC reliability for the first analog MOS transistor 506 and the second analog MOS transistor 552 compared to performing four sub-implants at twist angles of 45 degrees. In one version of the instant example, doses of the four sub-implants 532, 540, 544 and 546 may be substantially equal. In an alternate version, doses of the first sub-implant 532 and the second sub-implant 540 may be substantially equal to each other, and doses of the third sub-implant 544 and the fourth sub-implant 546 may be substantially equal to each other, and the doses of the first sub-implant 532 and the second sub-implant 540 may be different from the doses of the third sub-implant 544 and the fourth sub-implant 546 by at least 10 percent. In a further version, doses of the four sub-implants 532, 540, 544 and 546 may be different from each other by at least 10 percent.

While various embodiments of the present invention have been described above, it should be understood that they have been presented by way of example only and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. A method of forming an integrated circuit, comprising the steps:
    forming a gate of a metal oxide semiconductor (MOS) transistor over a substrate;
    forming an implant mask over said substrate so as to expose at least a portion of said gate and expose a portion of said substrate adjacent to said gate, so that said implant mask is separated from a first source/drain gate edge, and is separated from a second source/drain gate edge, opposite the first source/drain gate edge, by substantially equal lateral spaces; and
    forming drain extensions in said substrate adjacent to, and partially underlapping, said gate by implanting dopants in four sub-implants including:
        a first sub-implant at a tilt angle and at a first twist angle referenced to a horizontal normal line which lies in said top surface and is perpendicular to said first source/drain gate edge, wherein said first sub-implant clears said implant mask to implant a portion of said dopants into said substrate at said first source/drain gate edge, said first sub-implant being blocked from said second source/drain gate edge by said gate;
        a second sub-implant at said tilt angle and at a second twist angle referenced to said horizontal normal line opposite from said first twist angle, wherein the second twist angle differs from the first twist angle such that the first sub-implant and second sub-implant are asymmetric, and wherein said second sub-implant clears said implant mask to implant a portion of said dopants into said substrate at said first source/drain gate edge, said second sub-implant being blocked from said second source/drain gate edge by said gate;
        a third sub-implant at said tilt angle and a third twist angle 180° from the first twist angle, wherein said third sub-implant clears said implant mask to implant a portion of said dopants into said substrate at said second source/drain gate edge, said third sub-implant being blocked from said first source/drain gate edge by said gate;
        a fourth sub-implant at said tilt angle and a fourth twist angle 180° from the second twist angle, wherein said fourth sub-implant clears said implant mask to implant a portion of said dopants into said substrate at said second source/drain gate edge, said fourth sub-implant being blocked from said first source/drain gate edge by said gate.

2. The method of claim 1, wherein the first twist angle has a magnitude between 5 degrees to 40 degrees.

3. The method of claim 2, wherein said second twist angle has a magnitude of 5 degrees to 40 degrees.

4. The method of claim 2, wherein said second twist angle has a magnitude which is different from said magnitude of said first twist angle by at least 10 degrees.

5. The method of claim 2, wherein said second twist angle has a magnitude of 50 degrees to 85 degrees.

6. The method of claim 5, wherein said first sub-implant and said second sub-implant have substantially equal doses.

7. The method of claim 5, wherein a dose of said first sub-implant and a dose of said second sub-implant are different by at least 10 percent.

8. A method of forming an integrated circuit, comprising the steps:
    forming a first gate of a first MOS transistor over a substrate;
    forming a second gate of a second MOS transistor over said substrate, wherein the first gate is substantially parallel to the second gate;
    forming an implant mask over said substrate so as to expose at least a portion of said first gate and expose a portion of said substrate adjacent to said first gate, so that said implant mask is separated from a first edge of the first gate and from a second edge of the first gate by substantially equal lateral spaces, and is separated from a first edge of said second gate and from a second edge of said second gate by substantially equal lateral spaces; and
    forming first drain extensions in said substrate adjacent to, and partially underlapping, said first gate of said first MOS transistor, and forming second drain extensions in said substrate adjacent to, and partially underlapping, said second gate said second analog MOS transistor, by implanting dopants in four sub-implants including:

a first sub-implant at a tilt angle of at least 15 degrees and at a first twist angle having a magnitude of 5 degrees to 40 degrees, wherein said first sub-implant clears said implant mask to implant a portion of said dopants into said substrate at said first edge of said first gate, said first sub-implant being blocked from said second edge of said first gate by said first gate, and said first sub-implant clears said implant mask to implant a portion of said dopants into said substrate at said first edge of said second gate, said first sub-implant being blocked from said second edge of said second gate by said second gate;

a second sub-implant at said tilt angle and at a second twist angle having a magnitude of 50 degrees to 80 degrees referenced to said horizontal normal line opposite from said first twist angle, wherein said second sub-implant clears said implant mask to implant a portion of said dopants into said substrate at said first edge of said first gate, said second sub-implant being blocked from said second edge of said first gate by said first gate, and said second sub-implant clears said implant mask to implant a portion of said dopants into said substrate at said first edge of said second gate, said second sub-implant being blocked from said second edge of said second gate by said second gate;

a third sub-implant at said tilt angle and at a third twist angle 180 degrees opposite from said first twist angle, wherein said third sub-implant clears said implant mask to implant a portion of said dopants into said substrate at said second edge of said first gate, said third sub-implant being blocked from said first edge of said first gate by said first gate, and said third sub-implant clears said implant mask to implant a portion of said dopants into said substrate at said second edge of said second gate, said third sub-implant being blocked from said first edge of said second gate by said second gate;

a fourth sub-implant at said tilt angle and at a fourth twist angle 180 degrees opposite from said second twist angle, wherein said fourth sub-implant clears said implant mask to implant a portion of said dopants into said substrate at said second edge of said first gate, said fourth sub-implant being blocked from said first edge of said first gate by said first gate, and said fourth sub-implant clears said implant mask to implant a portion of said dopants into said substrate at said second edge of said second gate, said fourth sub-implant being blocked from said first edge of said second gate by said second gate; and said drain extensions are free of halo implanted regions having dopants of an opposite conductivity type from said dopants of said four sub-implants.

9. The method of claim 8, wherein said second twist angle has a magnitude which is different from said magnitude of said first twist angle by at least 10 degrees.

* * * * *